(12) United States Patent
Molsen

(10) Patent No.: US 6,573,959 B1
(45) Date of Patent: Jun. 3, 2003

(54) OPTICAL ELEMENT, A METHOD OF MAKING A DISPLAY DEVICE AND A DISPLAY DEVICE COMPRISING AN OPTICAL ELEMENT

(75) Inventor: Henning Molsen, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/553,539

(22) Filed: Apr. 20, 2000

(30) Foreign Application Priority Data

Apr. 24, 1999 (GB) .............................................. 9909379

(51) Int. Cl.⁷ ............................................. G02F 1/1336
(52) U.S. Cl. ...................................................... 349/113
(58) Field of Search ................................... 349/62, 113

(56) References Cited

U.S. PATENT DOCUMENTS 4,935,334 A    6/1990  Boettiger et al. ............ 430/322
5,004,673 A    4/1991  Vlannes ....................... 430/325
5,111,240 A    5/1992  Boettiger et al. .............. 355/53
5,706,066 A  * 1/1998  Sawayama et al. ......... 349/113
5,841,496 A  * 11/1998 Itoh et al. .................... 349/113
6,144,430 A  * 11/2000 Kuo ............................. 349/112
6,285,426 B1 * 9/2001  Akins et al. ................. 349/113
6,433,848 B1 * 8/2002  Nakamura et al. .......... 349/113

FOREIGN PATENT DOCUMENTS

EP          0271002         6/1988

* cited by examiner

Primary Examiner—James Dudek

(57) ABSTRACT

A reflective optical element is described comprising a microscopically structured surface with a reflective layer thereon. The reflective element allows for oblique incident light to be redirected and scattered into pre-determined angles by means of irregular piece-wise linear blazed structures.

The reflective optical element can be used as a blazed scattering reflector internal or external to a display device.

Several methods are described to produced such a reflective optical element.

28 Claims, 16 Drawing Sheets x,y Displaced ridge of blazed structure

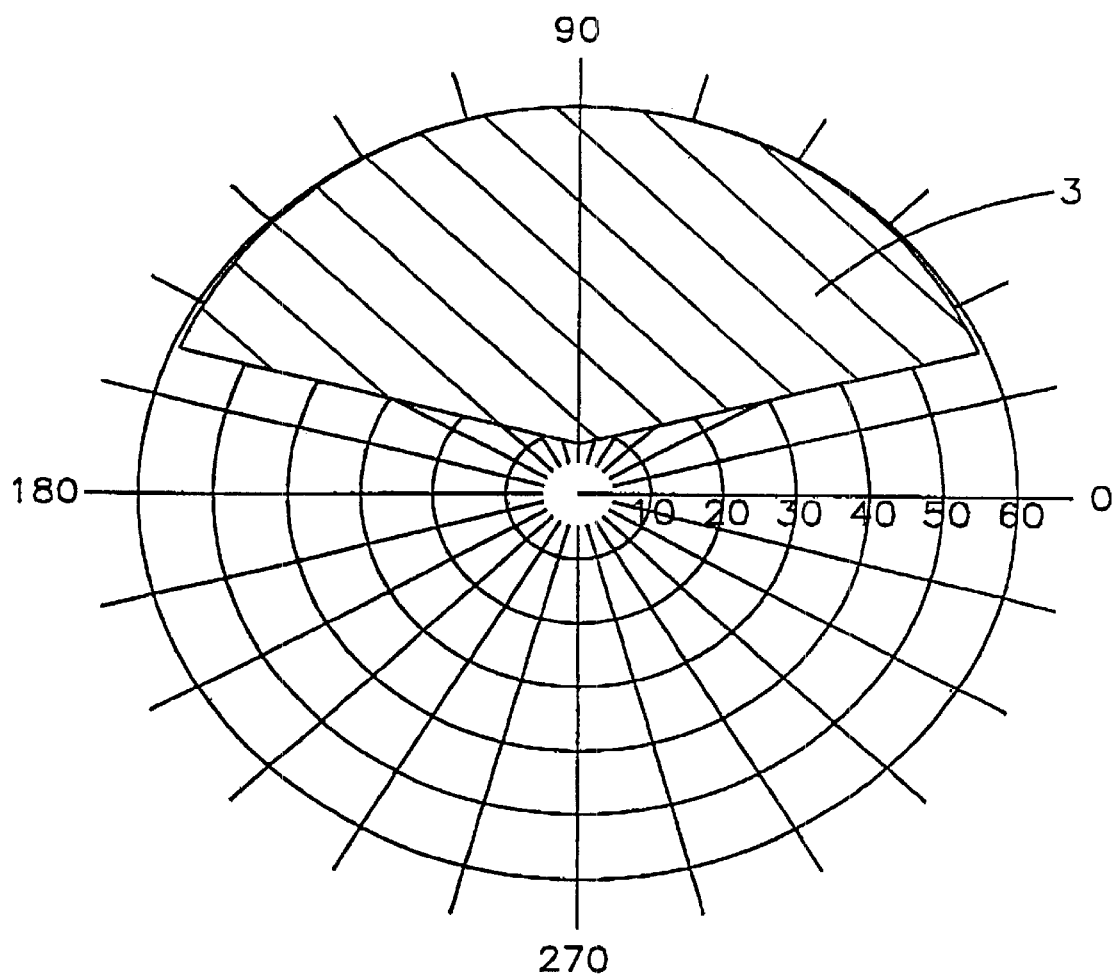

US 6,573,959 B1

OPTICAL ELEMENT, A METHOD OF MAKING A DISPLAY DEVICE AND A DISPLAY DEVICE COMPRISING AN OPTICAL ELEMENT

BACKGROUND OF THE INVENTION

1. Field of the Invention

The present invention relates to an optical element, namely reflector that alters the properties of light intentionally interacting with it. The present invention also relates to an optical element incorporated in to a display device and a method of manufacturing such a display device.

2. Description of the Related Art

Reflective display devices are well known. In principle, these consist of a light-modulating element, and a reflector disposed behind the light-modulating element. Light incident on the front of the light-modulating element passes through the element, is reflected by the reflector, and passes back through the light-modulating element. A reflective device had the advantage that, under suitable illumination conditions, it can utilise ambient light and does not require its own light source. For such a display to operate effectively, it is necessary that sufficient of the ambient light incident on the display is directed towards the observer so that a sufficiently bright display is produced.

Blazed reflectors can be used to redirect ambient light impinging on a reflective display at an oblique angle so that, after reflection, it exits the display substantially at normal incidence. This is advantageous since viewers of a display generally view the display from the normal direction, or from a near-normal direction, and the use of a blazed reflector creates a higher reflectance of the display towards such a viewer.

The principle of operation of a blazed reflector is illustrated in FIGS. 1(a) and 1(b).

In FIG. 1(a), light is incidence on a block 1 of material with a refractive index $n_i$ which has upper and lower surfaces that are parallel to one another. If light is incident on the front surface of the block 1 at an angle $\theta_0$ to the normal, it will undergo refraction at the front surface of the block 1. It will propagate within the block at an angle $\theta_i$ to the normal, where $\theta_0$ and $\theta_i$ are connected by Snell's Law, namely $\sin \theta_i = \sin \theta_0/n_i$ (assuming that the medium outside the block has a refractive index $n_0=1$).

A reflective layer 1', such as a metallic or dielectric layer, is disposed on the lower face of the block 1 of FIG. 1(a). Light transmitted through the block 1 is specularly reflected by the reflective layer 1' when it reaches the lower surface of the block, and is again refracted at the upper surface of the block so that it leaves the block at an angle $\theta_0$ to the normal. It can thus be seen that if light is incident on the upper surface of the block 1 at an oblique angle to the normal to the block, it will be reflected at an oblique angle of the same absolute value, and so will not reach an observer viewing the block from the normal direction.

The advantages of using a blazed reflector are illustrated in FIG. 1(b). In FIG. 1(b), the lower surface of the block is not a plane surface parallel to the upper surface of the block, but is in the form of a blazed reflector. As is well known, the reflective surface of a blazed reflector consists of segments, with each segment being inclined at an angle $\theta_m$ (known as "the angle of blaze"). A reflective layer 1' is disposed on the lower face of each segment.

Since the lower surface of the block is a series of inclined segments, light transmitted through the block at an oblique angle will be reflected closer to the normal of the display. Indeed, if the angle of blaze is chosen such that $\theta_m = \theta_i/2$, then the reflected light will be reflected in the normal direction. Use of a blazed reflector will thus increase the brightness of the display in a normal or near-normal direction.

If the refractive index of the block 1 is assumed to be $n_i=1.5$, the angle of blaze required to direct reflected light in the normal direction is $\theta_m=10°$ for the case $\theta_0 30°$. If $\theta_0=45°$, then the required angle of blaze is $\theta_m=14°$.

FIG. 2(a) is a polar diagram showing the preferred reflection cone 2 from a reflective display device for collimated light that is incident on the display at an azimuthal angle of 90° and a polar angle of +30°. If light is reflected within this cone, it will reach an observer viewing the display at a normal, or near-normal, angle.

FIG. 2(b) is a polar diagram showing a typical range 3 of possible positions for a light source for use with a reflective display device that incorporates a blazed reflector.

Reflective display devices are known which consist of a conventional liquid crystal display device, and a blazed reflector disposed behind the liquid crystal display device. A blazed reflector suitable for this application is typically produced by embossing a thermoplastic polymer film 4 disposed on a substrate 5, by moving a suitable embossing tool over the layer of photopolymer. This is illustrated schematically in FIG. 3. Once the photopolymer layer 4 has been embossed, a metallic film is then disposed over the photopolymer 4 to produce the blazed reflector. Manufacture of a blazed reflector in this way to described in U.S. Pat. Nos. 5,245,454 and 5,128,787.

Simply disposing a blazed reflector behind a conventional passive matrix LCD is only satisfactory if the extension of the second substrate normal to the display plane is small compared to the extension of the picture element (pixel) in the display plane. This approach is not compatible with active matrix LCDs, since components of the active matrix LCD, for example such as thin film transistors (TFTs), will shade the blazed reflector. A significant amount of light passing through the LCD will thus not reach the blazed reflector, but will instead be reflected at an oblique angle by the pixel electrodes or absorbed by other components of the LCD. Furthermore, the use of a blazed reflector that is external to the LCD can give rise to optical cross-talk between adjacent pixels, and it can also cause parallax problems. This leads to a loss of resolution of the display.

It is desirable for a blazed reflector to be disposed within a LCD, so that the problems of shading of the reflector and of optical cross-talk and parallax are eliminated or at least reduced in severity.

A further desired property of a reflector for use in a reflective display is that it reflects light into a range of angles around the exact direction of specular reflection. If such a reflector is used, it is then possible for the direct specular reflection of a light source to be directed away from the position of an observer while still ensuring that a significant amount of light is directed to the observer. This means that the glare at the observer's position is reduced, as the observer will not see an image of the light source.

U.S. Pat. Nos. 5,204,765, 5,408,345 and 5,576,860 in the name of Sharp Kabushiki Kaisha describe an internal electrode for a liquid crystal display which has diffuse reflecting properties. The reflector will direct light into a range of angles around the direction of specular reflection, and it also will preserve polariation of light incident on the reflector. However, this reflector is a symmetric reflector, and this technology has not yet been extended to produce an asymmetric diffuse reflector. Indeed, no-one has yet produced a blazed reflective TFT electrode suitable for internal use in a high resolution active matrix display. Furthermore, no-one has yet produced an asymmetric reflector which has diffuse reflecting properties.

It is, in principle, possible to create an internal blazed reflector using the embossing technique illustrated in FIG. 3, but in practice it is difficult to do this. One particular problem that arises with an active matrix LCD in which the blazed reflector is acting as a pixel electrode is that the metallic layer disposed over the photopolymer must be electrically connected to a thin film transistor (TFT) disposed on the substrate of the LCD. This requires that a through hole, or via, is created through the photopolymer layer 4, but this is difficult to do using conventional embossing techniques.

P. F. Grey discloses, in "Optica Acta", Vol. 25, pp. 765–75 (1978), forming optical diffusers having a defined profile using a laser speckle pattern. Coherent laser light is optically diffused, and is used to expose a photoresist. Different diffuser properties can be obtained from the photoresist, for example by varying the light dose, the exposure duration, or by using single or multiple exposures.

A known method for creating a grating structure in a layer of photoresist is a near field holography method which uses self-interference of the zero and first order diffraction below a phase shift mask. This is shown schematically in FIG. 4. Light from a light source 7 is directed onto a transmission diffraction grating 8. Zeroth order light transmitted by the grating 8 is directed by a first mirror 43 towards a phase shift mask 9, while first-order diffracted light from the grating is directed by a second mirror 44 towards the phase shift mask. The zeroth order light and the first order light interfere with one another, and a standing wave extending a few microns below the phase-shift mask 9 is set up. This allows a layer of photoresist 4 disposed on a substrate to be exposed in the non-contact mode preferred in production processes. The main drawbacks of this technique are the cost of the phase-shift mask, and the limited mask size which also limits the size of the grating structure that can be defined in the photoresist layer. Furthermore, this method cannot produce angles of blaze that are sufficiently small for the present application of a blazed reflector for a display device.

Another method for defining a diffraction grating in a layer of photoresist is disclosed by M. C. Hutley in "Diffraction Gratings", Academic Press, London, 1982, pp. 95–125. This method is schematically illustrated in FIG. 5. Light from a light source 10, such as an argon ion laser, is expanded by the combination of a stationery diffuser 11 and a rotating diffuser 11' and is then focused by a lens 12 to produce an expanded beam. This is incident on a semi-transparent mirror 13 which partially reflects the beam, and partially transmits the beam. The reflected portion is incident on a first mirror 14, and the transmitted portion is incident on a second mirror 15. The mirrors 14, 15 are arranged such that the two portions of the beam are directed onto a layer 4 of photoresist disposed on a substrate 5. An interference pattern is set up by the two beams, and the photoresist layer 4 is exposed by the interference pattern. This method has the advantage that either symmetric or asymmetric gratings can be defined in the photoresist layer, but it is disadvantageous since complicated optical path adjustment is required in order to set up the interference pattern. Furthermore, an asymmetric grating can only be produced if the layer 4 of photoresist is disposed on a transparent substrate. A TFT substrate is not uniformly transparent and contains opaque components.

U.S. Pat. Nos. 4,935,334 and 5,111,240 describe a method of producing a photoresist mask. These patents are specifically directed to varying the wall profile of a hole in the photoresist layer. These patents disclose a method of producing holes having a tapered wall profile, by partially exposing the photoresist layer through a mask, moving the mass and the photoresist layer with respect to one another, and subsequently exposing the photoresist layer again. Once the photoresist mask has been made, it is used as a mark in further processing steps, for example in the production of VLSI circuits; once these processing steps have been completed the photoresist layer is completely removed.

W. Dächner et al. (Appl. Optics, Vol. 36, p. 4675 (1997) describe a method for producing blazed structures in photoresist. It comprises the exposure of the photoresist with electromagnetic radiation through a grey-scale mask and the manufacture of a grey-scale mask.

SUMMARY OF THE INVENTION

A first aspect of the present invention provides reflective optical element comprising a microscopically structured surface with a reflective layer thereon. The reflective element allows for oblique incident light to be redirected and scattered into pre-determined directions by means of irregular piece-wise linear blazed structures. The reflective optical element may be manufactured by a method taught below.

A blazed structure is described by two angles. One describes the Shallow inclination ($\theta_m$ in FIG. 1b), the other the steep inclination (90° in FIG. 1b) with respect to the normal to the crest of a blazed segment. The blazed segment can have an additional curvature to it, for example convex or concave or a multitude of both in varying portions. Multiple segments are stringed together in a piece-wise linear method so that the plurality of normals to each segment's crest vary over a range of azimuthal angles with respect to the averaged of the normal to all crests. The relative probability of occurrence of a particular azimuthal angle can be pre-determined using for example a Gaussian distribution as the probability function of a pre-determined range of azimuthal angles.

Compared to the prior art this invention has the following advantages: At the same time, the angle of blaze, its profile (concave, convex or both) and the azimuthal distribution and its relative probability of the blazed structure can be pre-determined. This allows the precise prediction of the distribution of the scattered reflection.

A second aspect to the present invention provides an electro-optic display device comprising: first and second substrates; a layer of electro-optic material disposed between the first and the second substrate; and a reflector as defined above disposed behind the electro-optic material when the electro-optic display device is viewed. In this second aspect the reflector has only the function as described in the first aspect of the present invention. This aspect of the present invention is particularly useful where the extension of the second substrate normal to the display plane is small compared to the extension of the picture element (pixel) in the display plane.

A third aspect to the present invention provides an electro-optic display device comprising: first and second substrates; a layer of electro-optic material disposed between the first and the second substrate; and a reflector as defined above disposed between the electro-optic material and the second substrate, wherein the said reflector has electrically conductive properties and acts an electrode to the electro-optic material. This aspect of the present invention is particularly useful where the extension of the second substrate normal to the display plane is large compared to the extension of the picture element (pixel) in the display plane and therefore would cause parallax problems.

A method of manufacturing an optical element may be comprising the steps of:

(a) exposing a first part of a layer of photoresist;

(b) exposing a second part of the layer of photoresist to a different depth than the first part of the layer of photoresist; and (c) developing the photoresist.

When the layer of photoresist is developed, the resultant layer of photoresist will have regions of different thickness. Although the steps used in the method of this invention are similar to those disclosed in U.S. Pat. Nos. 4,935,334 and 5,111,240, in the present invention the layer of developed photoresist is incorporated into the optical element. This is in contrast to the prior art, which relate only to the production of a mask for use in subsequent processing steps such as, for example blocking liquid or dry etchants or as a graded resist for an ion implantation process. Once these processing steps have been completed, the mask of photoresist is completely removed.

This method of manufacturing an optical element is suitable for manufacturing an internal optical element within a display device such as, for example, an LCD or other electro-optical display device.

The method may comprise the further step of (d) disposing a reflective layer over the layer of developed photoresist. This will provide a reflector with an inclined reflecting surface.

The duration of the second exposure step may be different to the duration of the first exposure step. Alternatively, the intensity of radiation used in the second exposure step may be different to the intensity of radiation used in the first exposure step. These are convenient methods of exposing the second part of the layer of photoresist to a different depth than the first part of the layer of photoresist.

The photoresist layer may be exposed through a mask, and the mask may be moved relative to the layer of photoresist between the two exposure steps, or the mask may be moved relative to the layer of photoresist continuously during steps (a) and (b). Alternatively, the light source may be moved relative to the layer of photoresist between the two exposure steps, or the light source may be moved relative to the layer of photoresist continuously during steps (a) and (b). These are convenient ways of ensuring that different parts of the layer of photoresiut are exposed in the two exposure steps.

The method may comprise the further step of (e) exposing a third part of the layer of photoresist through the entire depth of the layer of photoresist, with this step being carried out before the step of developing the photoresist. This will create a through hole, or via, through the layer of photoresint, and this can be used to allow electrical connection between components on opposite sides of the layers of photoresist. For example, if the layer of photoresist is disposed over an active matrix substrate, the via can be used to connect a thin film transistor (TFT) on the active matrix substrate to an electrode disposed over the layer of photoresist.

The reflective layer may be an electrically conductive layer. The reflective layer can then be used as a reflective electrode. Furthermore, if a via has been created in the layer of photoresist, the step of disposing the electrically conductive layer over the photoresist will result in the via being filled with the electrically conductive material, thus creating an electrical connection through the layer of photoresist. This allows the reflective electrode to be connected to an associated switching element disposed on the other side of the layer of photoresist.

The reflective layer may be a metallic layer.

The mask used in the exposure steps may comprise a plurality of transparent lights defined in an opaque background. (The word "transparent" and "opaque" as used herein mean that the mask is transparent or opaque to the wavelength of light used to expose the photoresist.) Use of such a mask in the exposure steps will lead to the formation of a plurality of regions of reduced depth in the layer of developed photoresist, so that a blazed reflector having a plurality of inclined reflective surfaces will be formed when the reflective layer is disposed over the layer of developed photoresist.

The transparent lights defined in the mask may be piecewise linear and irregular. In this case the "crests" of the blazed grating will not form straight lines, but will be irregular lines. This will mean that light reflected from the reflector will also be diffused, so that light will be reflected in a range of angles around the direction of specular reflection. Thus, a an asymmetric reflector that also diffuses light—that is, one that reflects light into a range of angles around the direction of specular reflection—is formed.

The transparent lines may be substantially parallel to one another. Alternatively, the separation between adjacent transparent lines may have random variations. These will result in corresponding random variations in the separation between adjacent crests of the reflector; these will cause scattering of reflected light in different azimuthal angles, and so will increase the diffuse nature of the reflected light.

The method may comprise the further step of (f) exposing the layer of photoresist to light having an intensity that varies randomly over the area of the layer of photoresist, this step being carried out before step of developing the photoresist. The exposure dose is set so that it does not fully expose the photoresist, but only creates additional, small variations in the thickness of the photoresist layer after development. These small thickness variations further increase the scattering of reflected light.

Step (f) may comprise exposing the layer of photoresist to a laser speckle pattern. The size and intensity of the laser speckle pattern will determine the size of the thickness variations in the developed photoresist layer.

While the method described above is preferred, the aspects 1 to 3 of the invention may also be achieved by employing a gray-scale mask which may be prepared by the method described above. In particular for the second aspect of the invention others methods of manufacture are conceivable, for example the embossing technique described above.

The method taught above provides a method of manufacturing an electro-optic display device comprising the steps of:

i) manufacturing an active matrix substrate;

ii) disposing a layer of photoresist over the active matrix substrate; and iii) exposing and developing the layer of photoresist by a method defined above.

This allows the manufacture of a display device incorporating an internal optical element. As an example, an active matrix display can be provided with an internal blazed reflector, with the reflector also acting as the pixel electrode. The reflector can easily be connected to TFTs on the active matrix substrate, through a via in the layer of photoresist. Since the blazed ref lector is disposed over the active matrix substrate it is not shaded by any of the components of the active matrix substrate, in contrast to the prior art case of an external reflector disposed behind the display. Disposing the reflector within the display also reduces both parallax and cross-talk between adjacent pixels.

BRIEF DESCRIPTION OF THE DRAWINGS

Preferred embodiments of the present invention will now be described by way of illustrative examples with reference to the accompanying Figures, in which:

FIG. 2(b) is a polar diagram illustrating possible positions for a light source used with a reflective display device incorporating a blazed reflector;

DESCRIPTION OF THE PREFERRED EMBODIMENTS

Figure 6A:
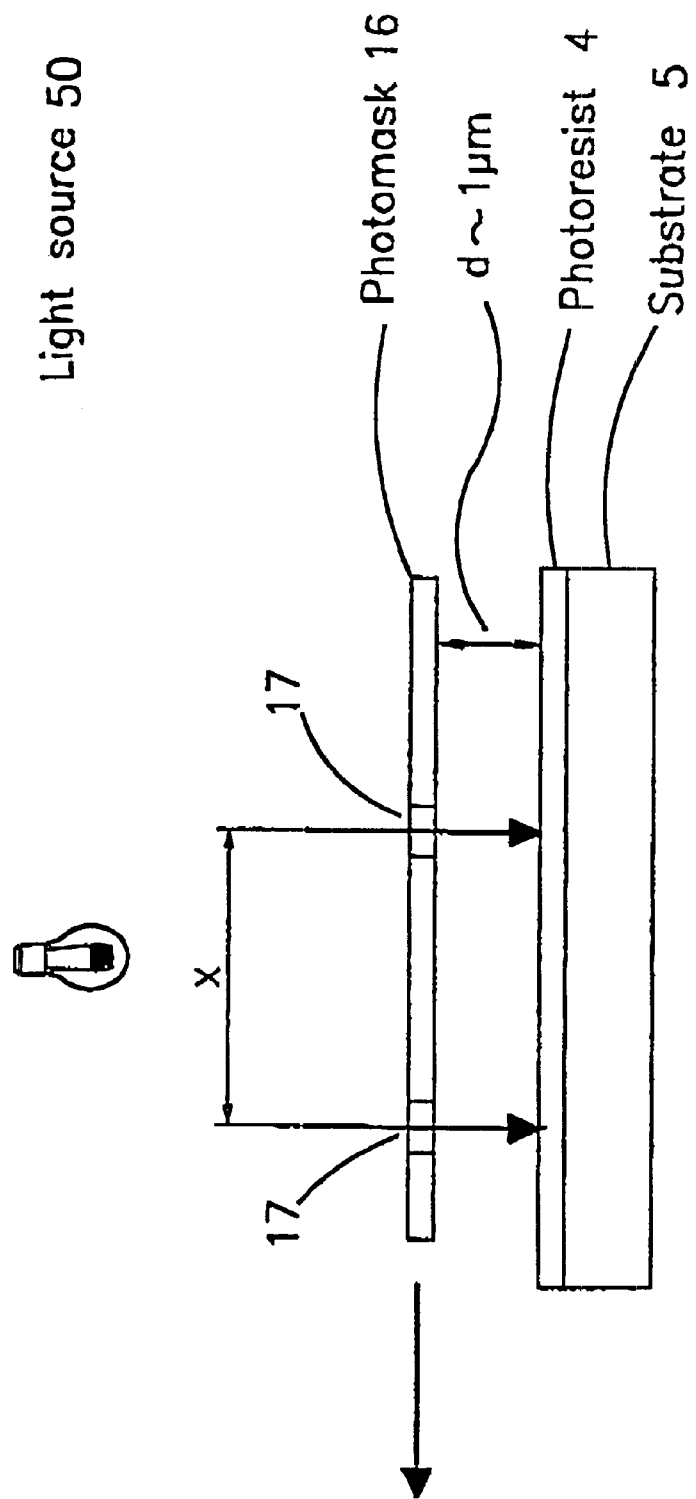
FIGS. 6(a) to 6(d) are schematic illustrations of a process for producing holes having a tapered profile in a layer of photoresist.

FIG. 6(a) is a schematic illustration of a method useful for the present invention. This shows a layer of positive photoresist 4 disposed on a substrate 5. The layer of photoresist 4 is illuminated through a mask 16 having apertures (transparent lights) 17. The mask 16 can be moved laterally relative to the layer of photoresist 4, so that different regions of the layer of photoresist 4 can be exposed by radiation from the light source 50. Two apertures 17 in the mask 16, spaced by a distance X from one another, are shown in FIG. 6(a), but the invention is not limited to a mask having two apertures. Using projection photolithography the distance between the photoresist 4 and the mask 16 can be increased to more than 1 micrometer.

A method of producing recesses, which have a varying depth, in the layer of photoresist 4 will now be described with reference to FIGS. 6(b) to 6(d). For clarity, only one aperture 17 is shown in the mask 16 in FIGS. 6(b) to 6(d).

Figure 6B:
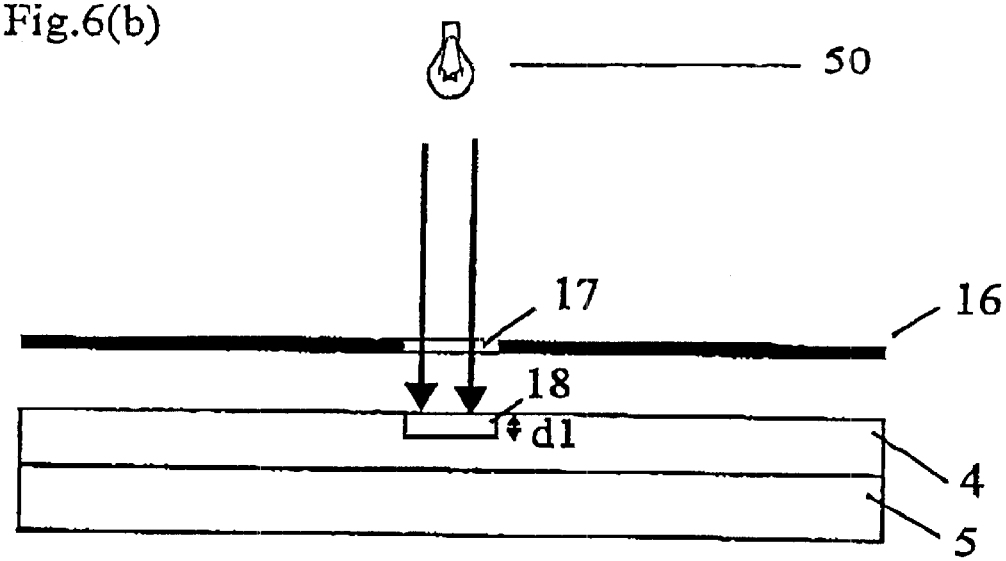

FIG. 6(b) shows a first exposure step. In this step, a first region 18 of the photoresist layer is exposed to light through the aperture 17 in the mask 16. The intensity of the exposing radiation, and the duration of the exposure step, are controlled such that the first region 18 is exposed to a depth $d_1$.

As the layer of photoresist 4, a layer of pre-baked (soft-baked) positive photoresist such as, for example, photoresist 1828 by Shipley, having a thickness in the range 1–4 $\mu$m is suitable. In general, a photoresist exhibiting a close to linear dependency between the exposure depth and the dose of exposure light are preferred. The radiation used in the exposure step can be of any wavelength to which the photoresist is sensitive. For the case of the 1828 photoresist by Shipley, ultraviolet radiation from the so-called i-line from a mercury light to suitable.

Once the first exposure step has been completed, the mask 16 is displaced laterally with respect to the layer of photoresist 4. A second exposure step is then carried out, as shown in FIG. 6(c). A second region 19 of the photoresist layer is then exposed to radiation. The intensity of the exposing radiation and/or the duration of the exposure step are chosen such that the region 19 of the photoresist layer 4 is exposed to a depth $d_2$, where $d_2 > d_1$.

The photoresist layer 4 is then developed. A suitable development step would be a wet etch in an aqueous sodium hydroxide solution (Microposit™ 351 CD 51 by Shipley) for 60 seconds. Alternatively, a dry plasma etch would be suitable.

During the development step, the photoresist exposed to radiation in the exposure steps will be removed at a greater rate than the non-exposed photoresist. This will mean that the layer of developed photoresist 4' will have a recess 40 with a base 41 that partially slopes in a direction parallel to the direction of movement of the mask during the exposure steps. The profile of the developed layer of photoresist in shown in FIG. 6(d).

The method described above with regard to FIGS. 6(b) to 6(d) is generally similar to the method disclosed in U.S. Pat. Nos. 4,935,334 and 5,111,240. In the present invention, however, the layer of developed photoresist is incorporated into an optical element, whereas the photoresist layer in U.S. Pat. Nos. 4,935,334 and 5,111,240 is used as a mask in subsequent processing steps and then removed.

Figure 6C:
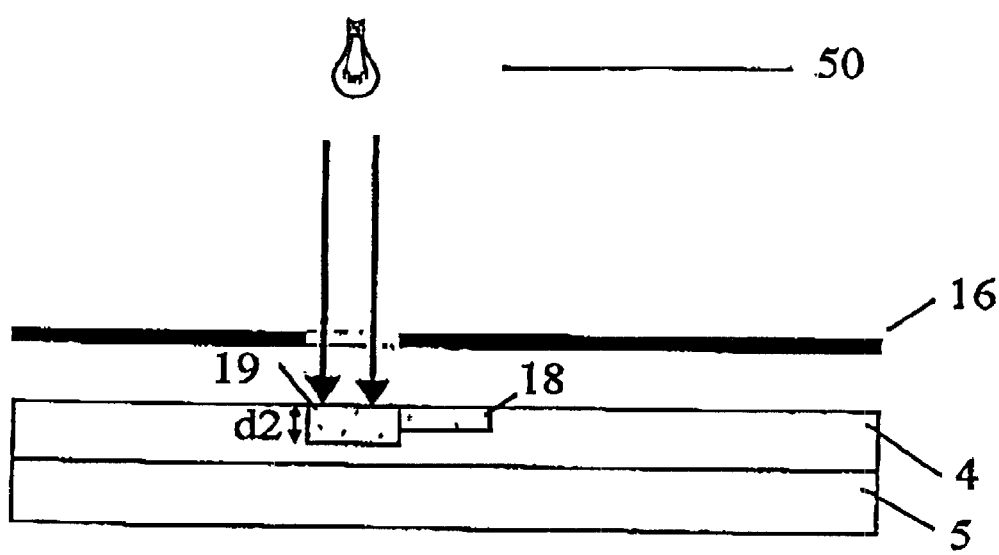
Figure 6D:
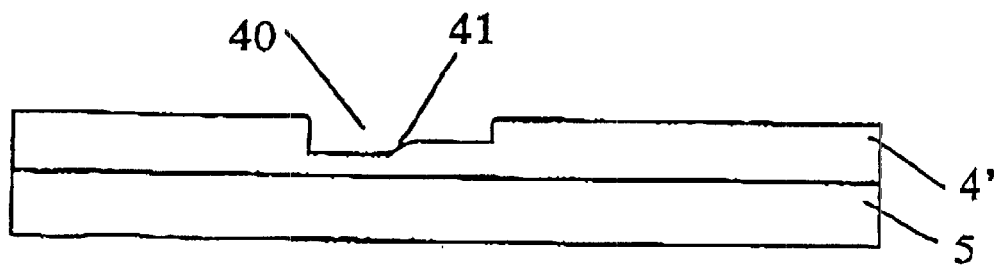

When the developed photoresist layer of FIG. 6(d) is coated with a reflective coating, such as a metallic coating, the portion of the reflector corresponding to the portion A of the layer of photoresist will be inclined with respect to the remaining portion of the reflector. If a mask having a plurality of apertures is used, a blazed reflector having a plurality of inclined regions will be produced.

In the FIGS. 6(b) to 6(d) the first and second exposed regions of photoresist 18, 19 do not overlap. However, it is possible for the second exposed region of photoresist to partially overlap one another, since this will still produce a recess having an inclined base upon development of the exposed photoresist.

Figure 7A:
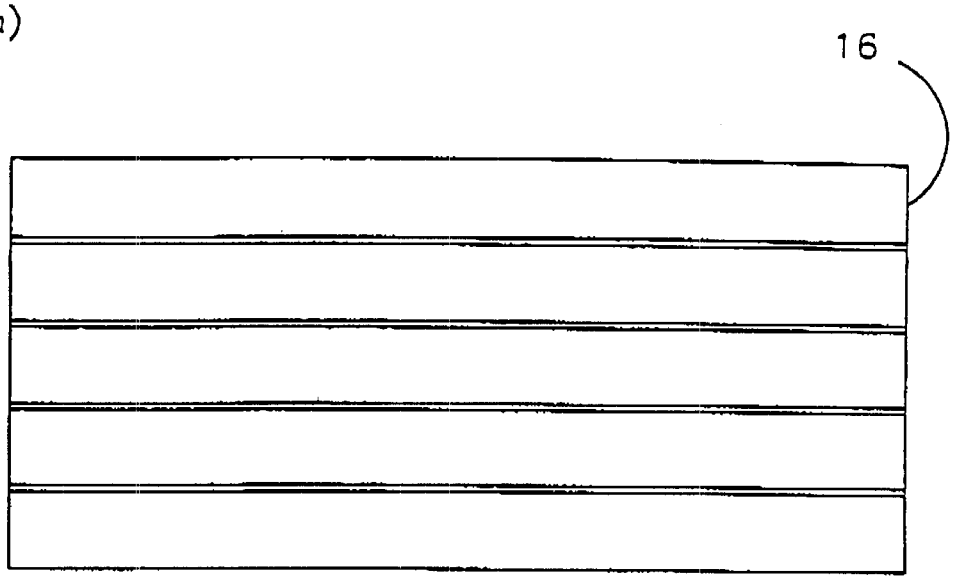
FIGS. 7(a) and 7(b) are a schematic illustrations of masks suitable for use in the present invention.

FIG. 7(a) shows a plan view of one mask suitable for use in the present invention. This mask consists of a plurality of transparent lines defined in an opaque background. The transparent lines are substantially parallel to one another. The mask is preferably moved in a direction that is substantially perpendicular to the transparent lines between the exposure steps, although it can in principle be moved in any direction that is not parallel to the transparent lines.

Figure 8:
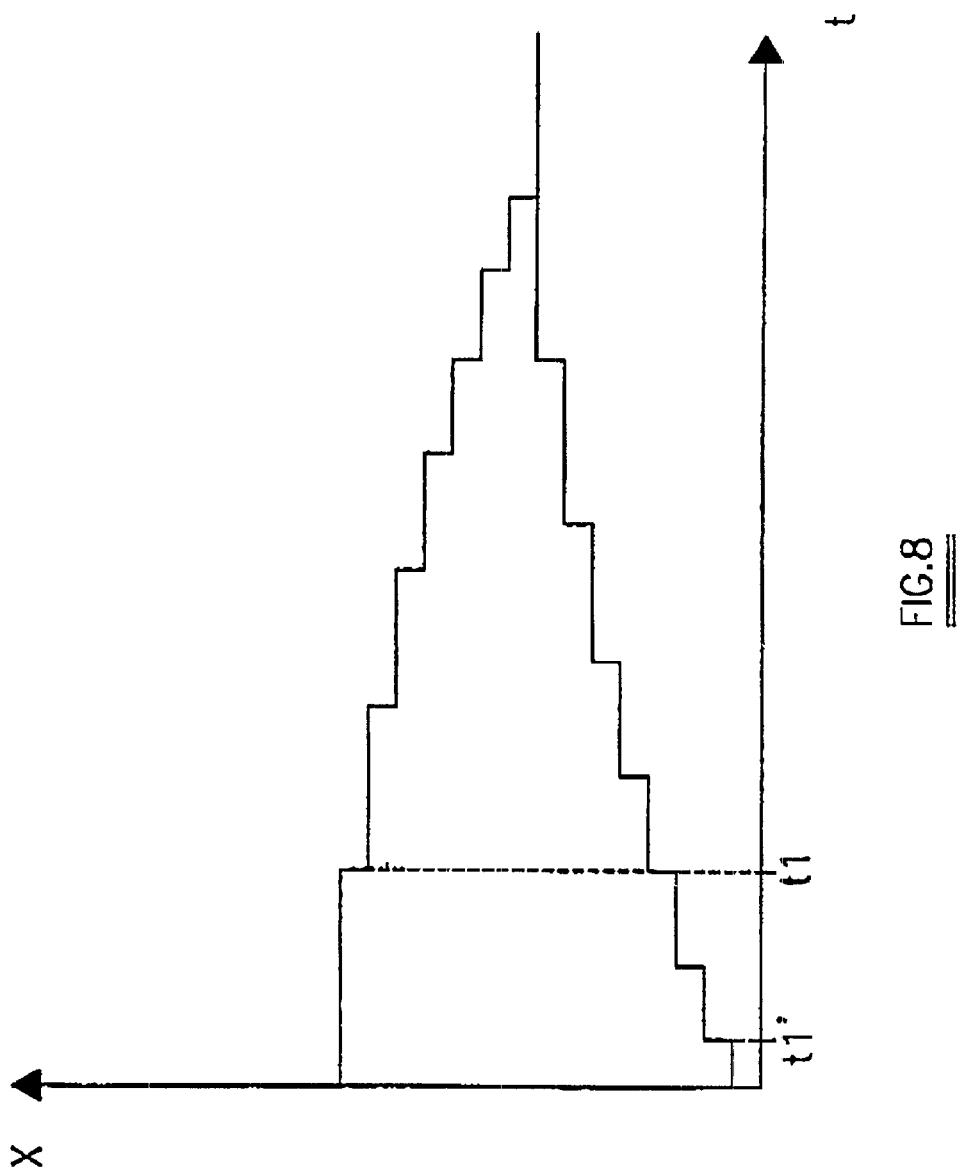
FIG. 8 is a schematic illustration of the displacement as a function of time of the mask of FIG. 7.

In the method described with regard to FIGS. 6(b) to 6(d), there are only two exposure steps. In practice, there will be more than two exposure steps. FIG. 8 illustrates two possibilities for the displacement of the mask a function of time for a method similar to that of FIGS. 6(b) to 6(d) but containing 8 exposure steps.

The upper step function shown in FIG. 8 shows the displacement of the mask over time required to give a positive slope in the exposed photoresist relative to the direction of movement of the mask. In this method, the first exposure step, which occurs from t=0 to t=$t_1$ is the longest, so that the depth of exposure of the photoresist will be the greatest. The duration of the subsequent exposure steps is reduced successfully, so that the depth of exposure of the photoresist in each subsequent exposure step will be less than in the preceding exposure step.

The lower step function shown in FIG. 8 will produce a negative slope in the developed photoresist, compared to the direction of movement of the mask. In the step function shown in the lower trace of FIG. 8, the first exposure step from t=0 to t=$t_1$' has the smallest duration, and so will expose the photoresist layer to the shallowest depth. The duration of the subsequent exposure steps increases.

In the displacement/time relationships of FIG. 8, the time occupied by movement of the mask from one exposure position to the next is very much smaller than the duration of the shortest exposure step. It is thus possible for the mask to be continuously illuminated—that is during the movement of the mask as well as during the exposure steps. If, however, the time occupied by movement of the mask from one exposure position to the next is comparable with, or greater than, the duration of the shortest exposure step, it is preferable to use an intermittent illumination method in which the mask is illuminated only during the exposure steps but not during the movement of the mask.

Figure 9:
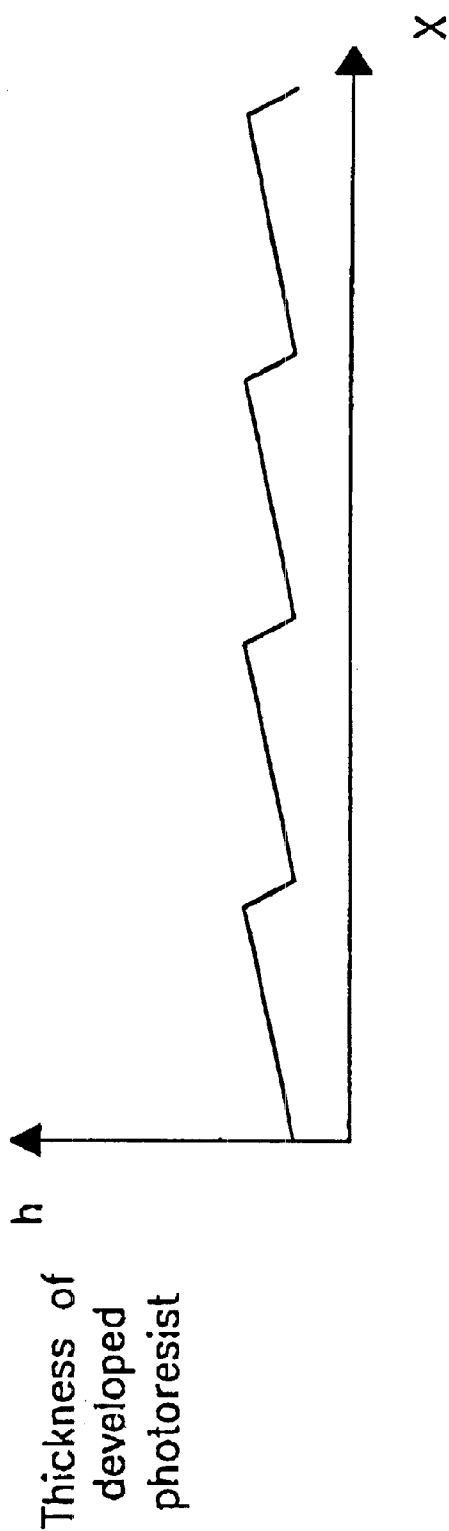
FIG. 9 is a schematic cross section of the resultant profile of the photoresist layer if the descending step function of FIG. 8 is used.

The cross-section of the developed photoresist that is obtained by using the mask of FIG. 7(a), and moving it according to the lower step function of FIG. 8 is shown schematically in FIG. 9. (FIG. 9 assumes that the mask is moved from right to left relative to the layer of photoresist.) It will be seen that the developed photoresist layer has a blazed profile.

Figure 10A:
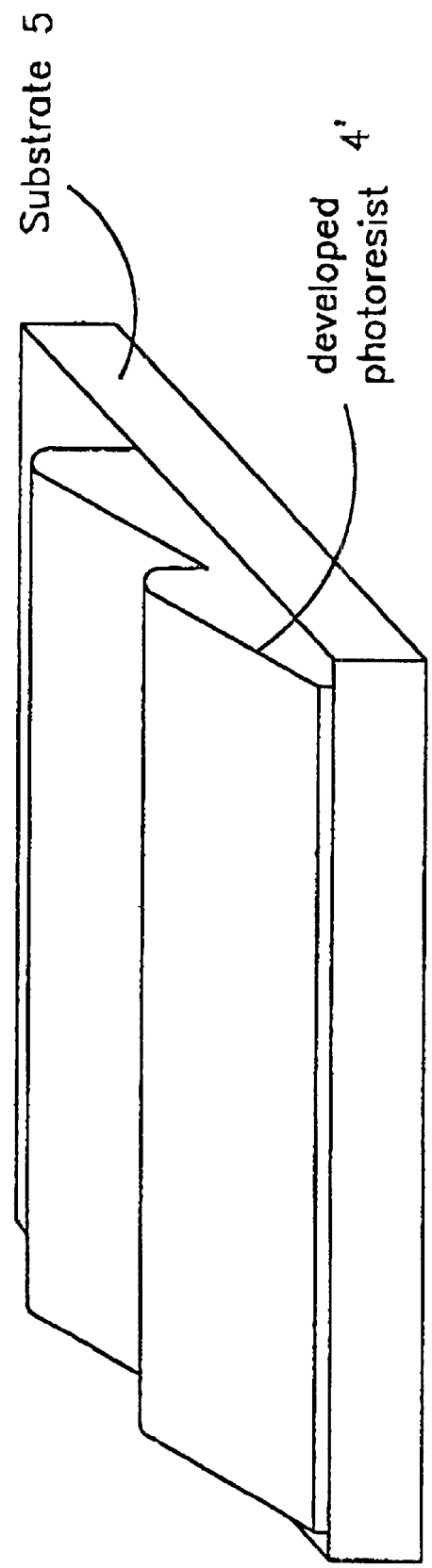
FIGS. 10(a) and 10(b) are schematic isometric views of a blazed photoresist layer produced by the method using the masks of FIGS. 7(a) and 7(b) respectively.

FIG. 10(a) is a schematic isometric view of the layer of developed photoresist 4' of FIG. 9.

In an alternative method, the mask is continuously illuminated during the process of exposing the photoresist, and is moved continuously across the layer of photoresist. In this embodiment, the depth of exposure of the photoresist is varied by varying the speed of movement of the mask relative to the photoresist. To provide a positive slope in the layer of photoresist, the speed of movement of the mask with respect to the photoresist would initially be small, and would be increased with time. As the speed of movement the mask increased, the depth of exposure of the photoresist would decrease. Conversely, to produce a negative slope in the layer of developed photoresist, the mask would initially be moved at a low speed relative to the photoresist and the speed of movement of the mask would be increased with time so as to decrease the exposure depth of the photoresist. The acceleration of the mask is selected to provide the desired profile in the developed photoresist, and can either be constant or vary with time.

In another embodiment said blazed scattering reflector is produced with a grey-scale photomask. The grey-scale photomask can be used in conjunction with a relative movement between the photomask and the substrate. This is particularly useful if the grey-scale mask has only very few grey-scales. Alternatively, the grey-scale photomask can be used avoiding the relative movement between photomask and substrate described above.

One of several known techniques may be employed to produce a grey-scale mask, for example E beam sensitive produce a grey-scale mask, for example E beam sensitive glass which darkens with increasing dose (HEBS-glass, Canyon Materials, Inc.) as described by W. Däschner et at., Appl. Optics, Vol. 36,p. 4675 (1997).

At any particular position the exposure of the photoresist through a grey-scale photomask results in varying exposure depth according to the optical density of the photomask.

Figure 1A:
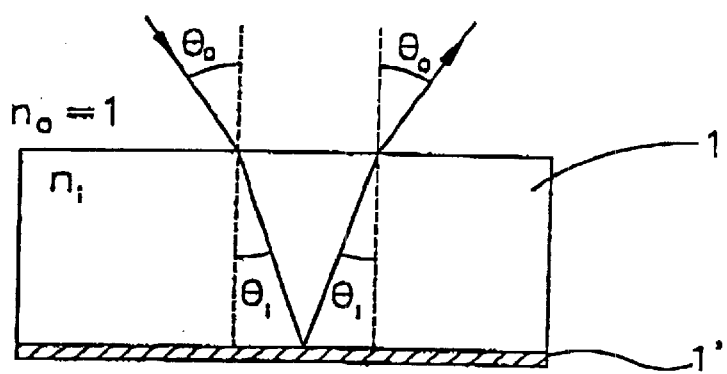
FIGS. 1(a) and 1(b) are schematic diagrams illustrating operation of a reflective display device incorporating a conventional reflector and a blazed reflector respectively.
Figure 1B:
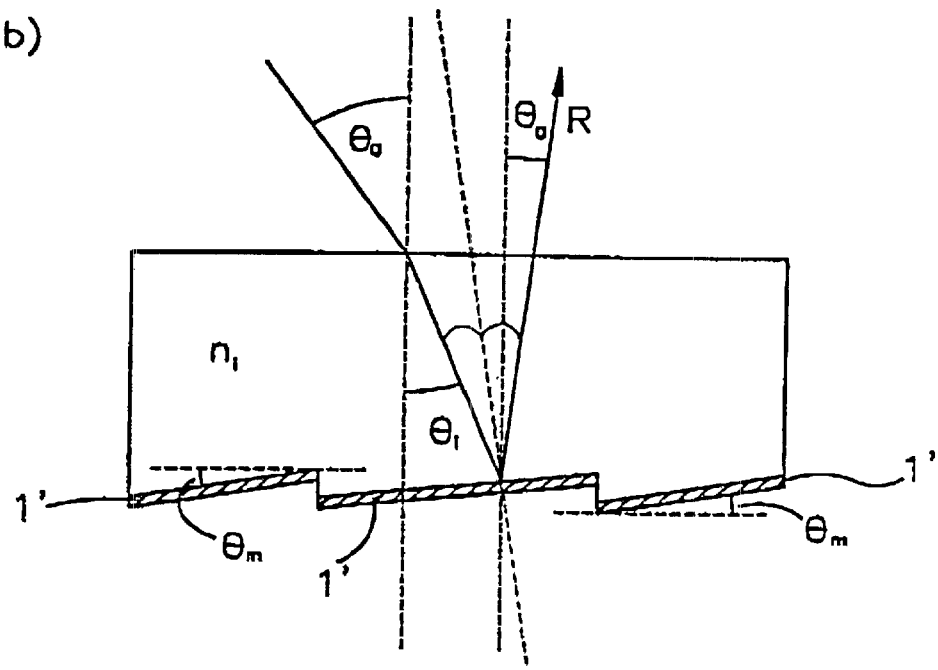
Figure 2A:
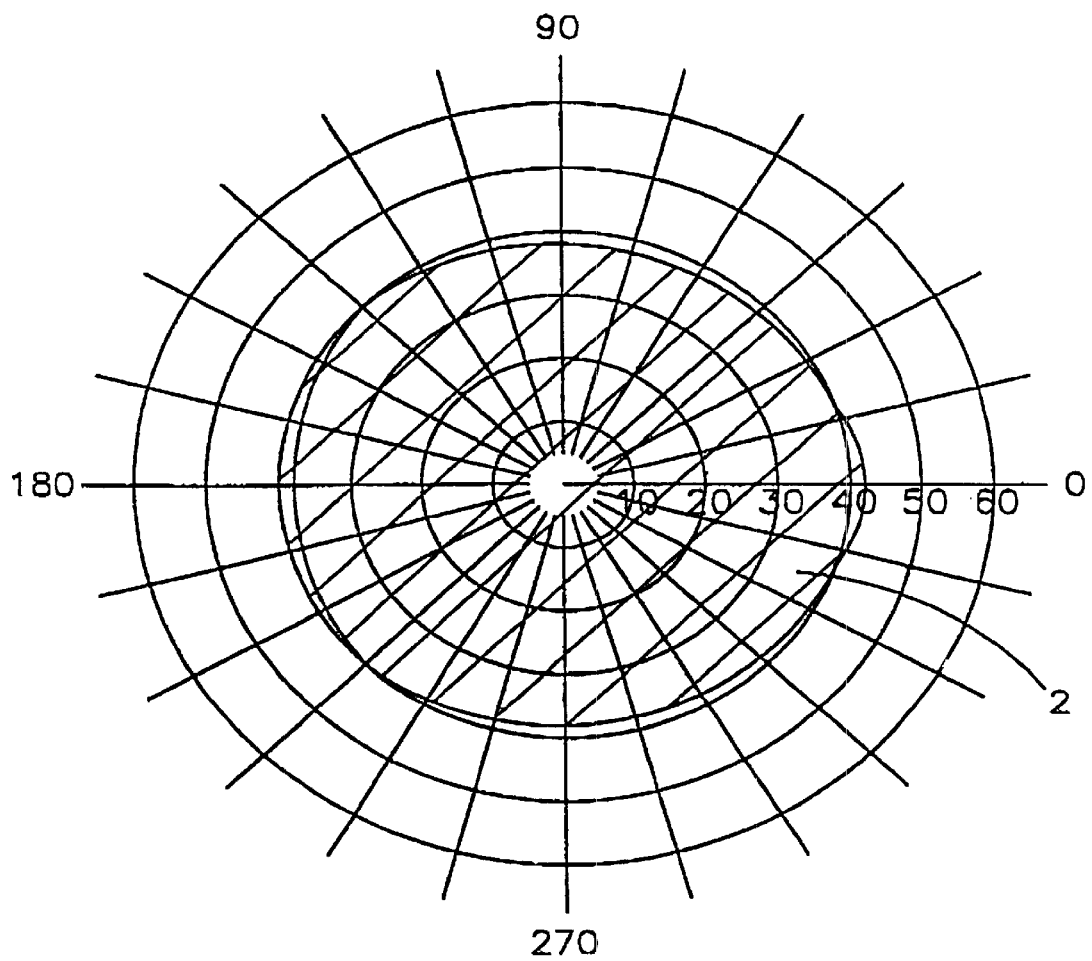
FIG. 2(a) is a polar diagram showing the preferred direction of light reflected from a reflective display device.
Figure 3:
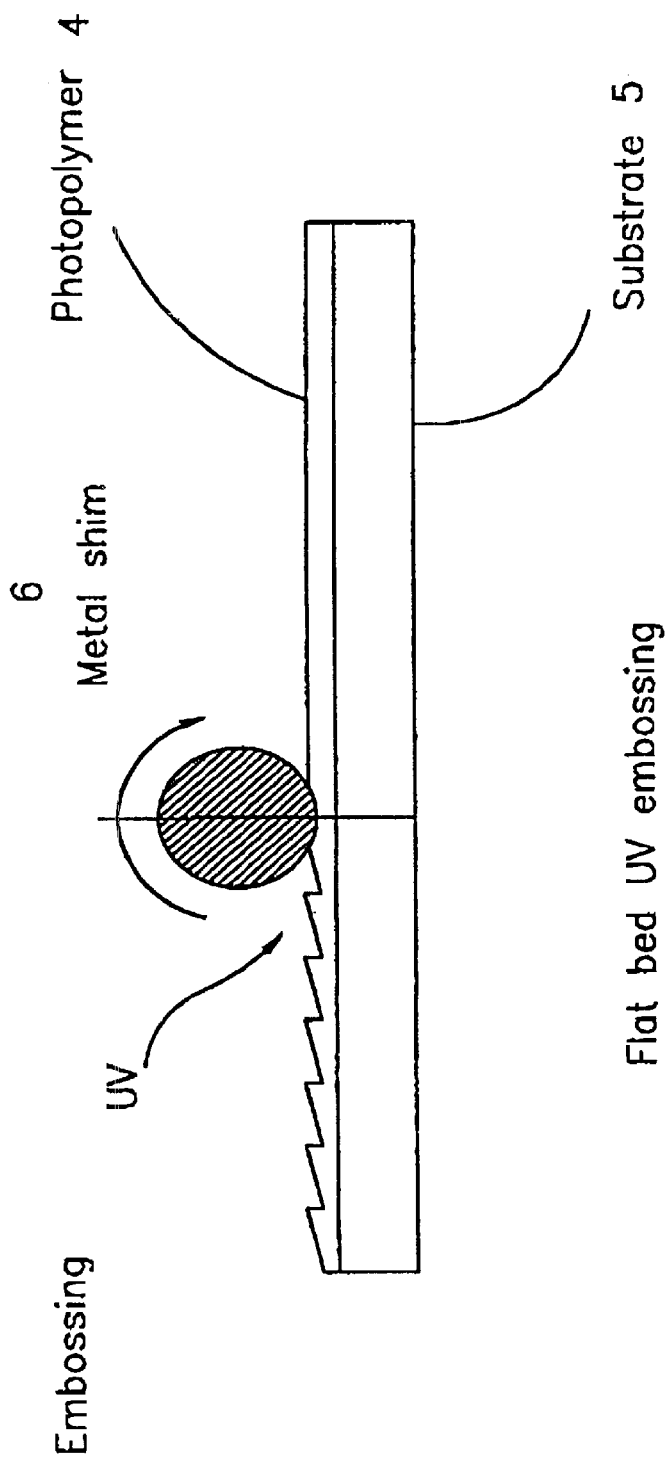
FIG. 3 is a schematic diagram of a conventional method of embossing a blazed reflector in a layer of photopolymeric material.
Figure 4:
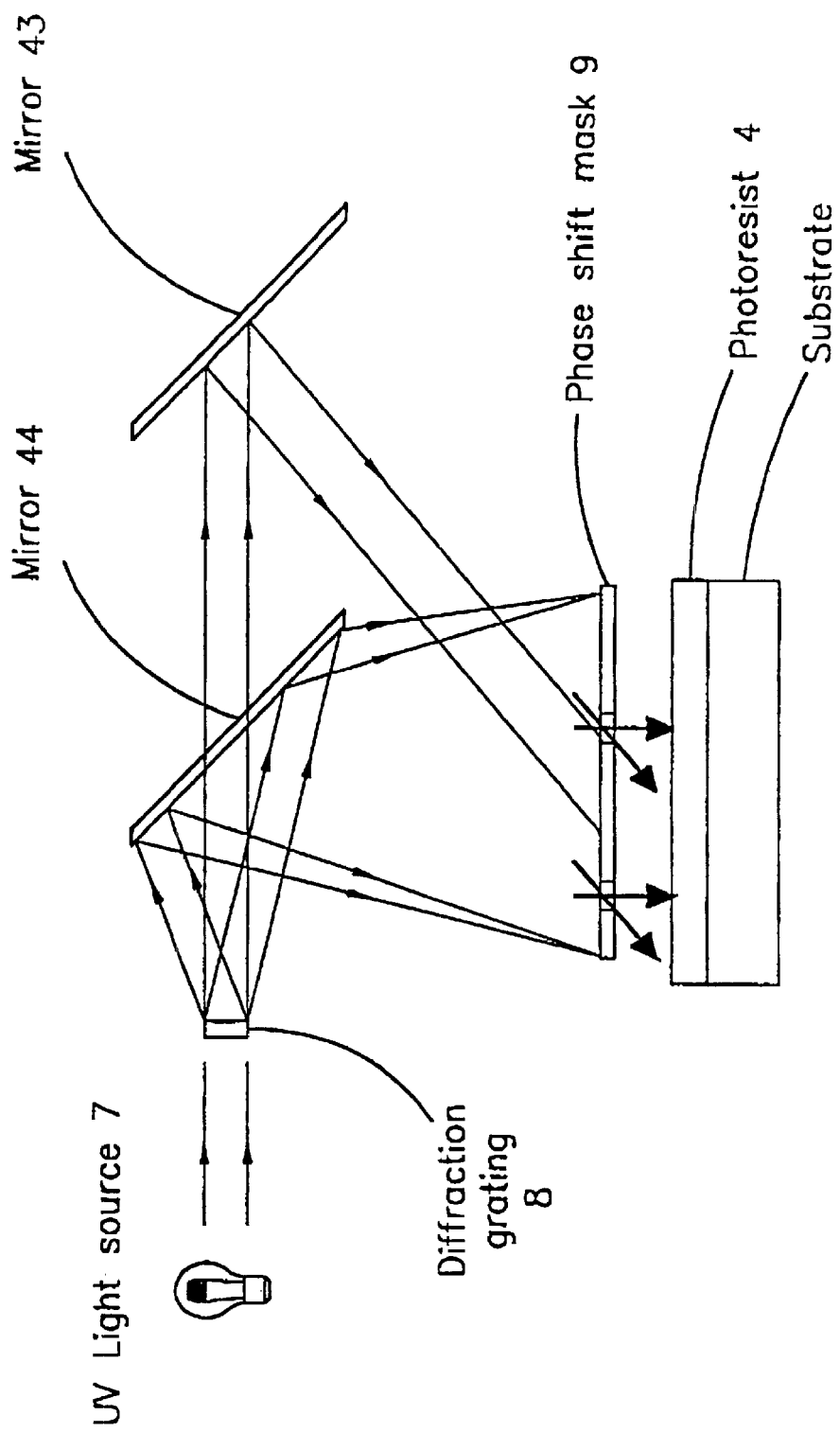
FIG. 4 is a schematic illustration of a conventional near-field holography method of defining a diffraction grating in a layer of photoresist.
Figure 5:
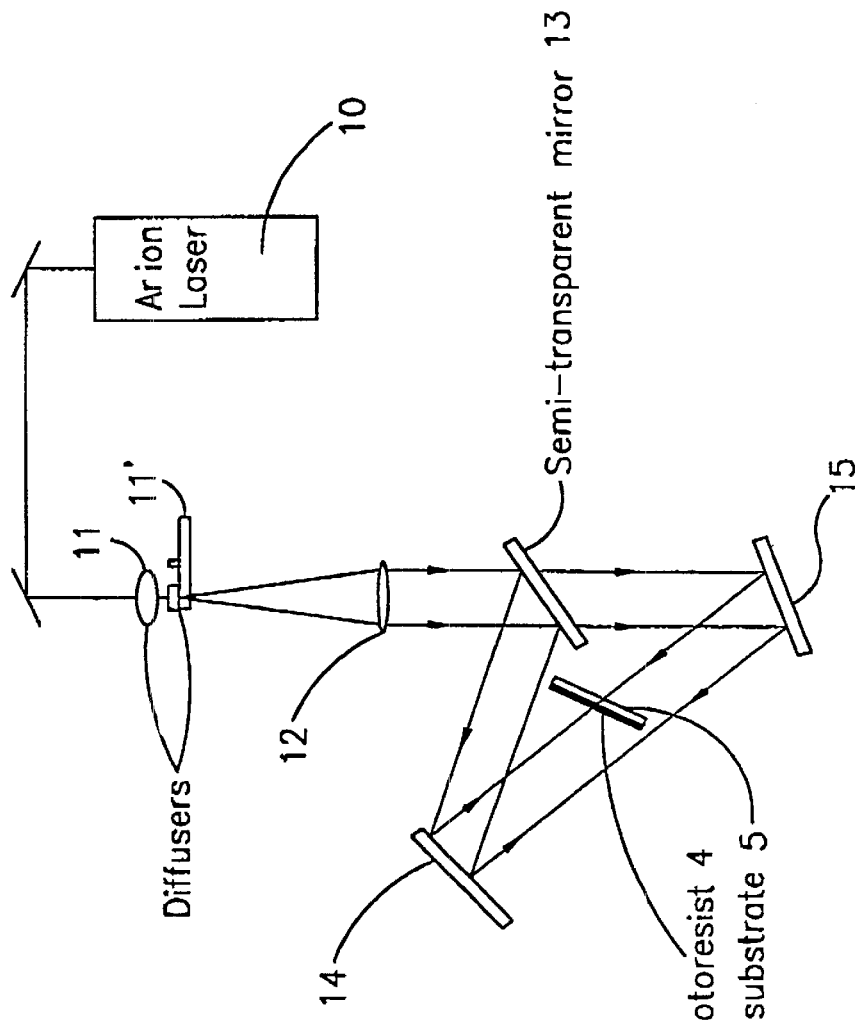
FIG. 5 is a schematic illustration of an optical system for interferometric exposure of a photoresist in order to define a blazed grating within the photoresist.
Figure 10B:
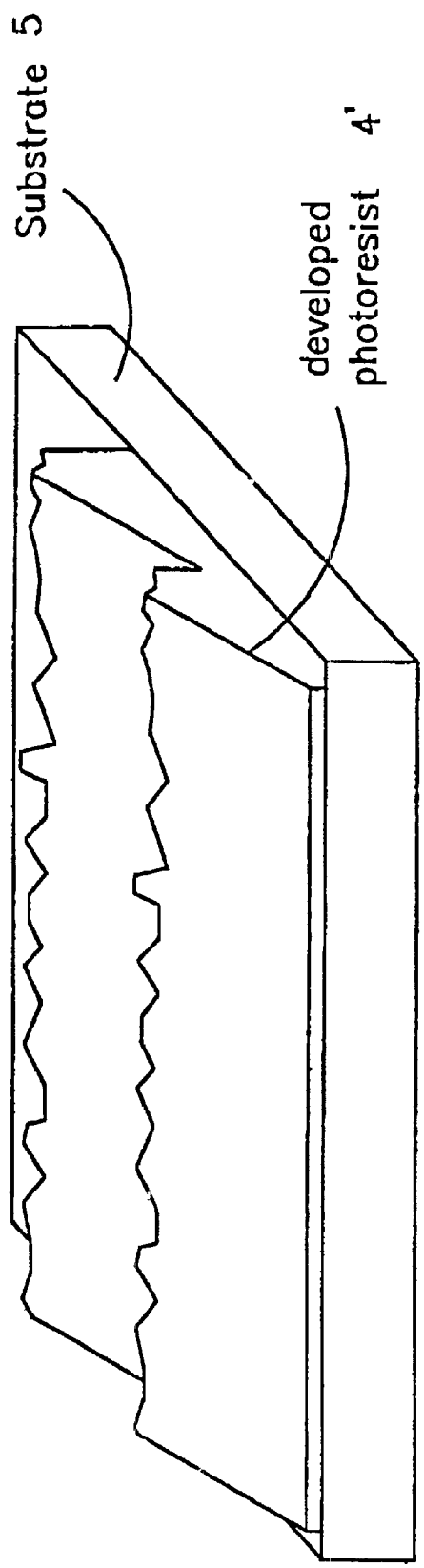

In another embodiment said blazed scattering reflector with the described properties shown in FIG. 10(b) is produced by another method, for example embossing as schematically shown in FIG. 3. The blazed scattering reflector may preferentially be used behind the second substrate in conjunction with a passive matrix LCD. The methods described above may be used in the manufacture of the metal shim 6.

Once the photoresist has been developed, it is provided with a reflective coating in order to form a reflector. In principle, any reflective coating can be applied to the photoresist, but it is convenient in practice to apply a reflective coating that is the reflective coating is electrically conductive, the reflector can be used as a reflective electrode.

Figure 11:
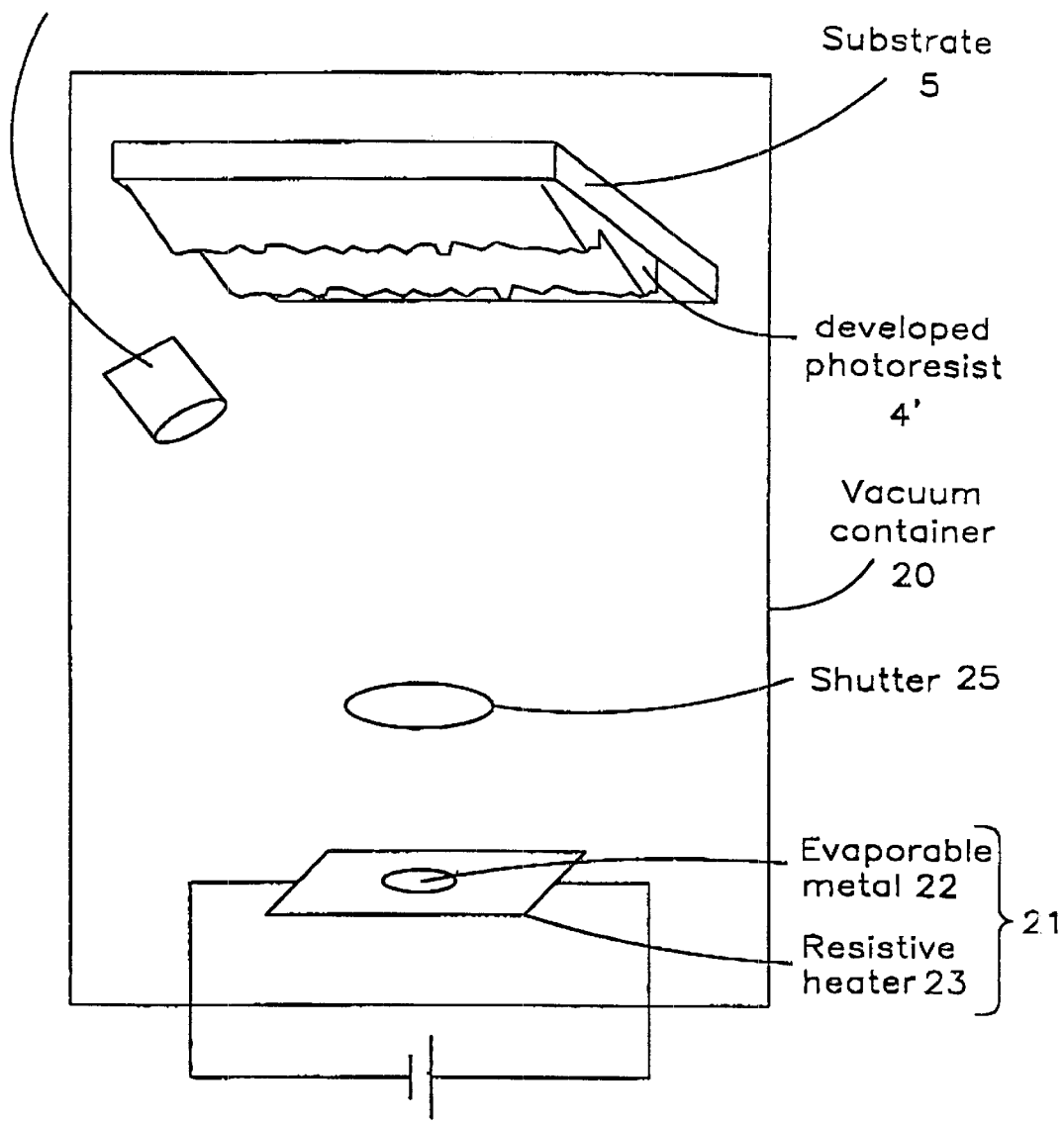
FIG. 11 is a schematic diagram of an apparatus suitable for depositing a reflective layer on the photoresist layer of FIG. 9.

FIG. 11 is a schematic view of an apparatus for providing a developed layer of photoresist with a metallic coating, by evaporating metal onto the photoresist layer. The apparatus essentially comprises an evaporation source 21 disposed within a vacuum container 20. The evaporation source 21 comprises a source of metal 22 and a heater 23, such as for example a resistive heater, for heating the metal.

The metal source 22 is disposed on a tray, or is loaded into a tungsten coil. The substrate 5 is loaded into the vacuum chamber 20, with the layer of developed photoresist facing the metal source 21. The vacuum chamber is made sufficiently large that the substrate will not be deformed by heat from the metal source 21.

In operation, the vacuum chamber 20 is initially evacuated. When the pressure falls below $10^{-6}$ mbar, the heater 23 for heating the metal 22 is switched on, and the metal is heated until the rate of deposition of metal has reached 1 nm/s. The deposition rate is monitored by a monitor 24.

Once the deposition rate has reached the desired value, a shutter 25 disposed between the metal source 21 and the substrate 5 is opened, and remains open until a metallic layer having a predetermined thickness has been deposited on the developed photoresist. The shutter 25 is then closed, and the heater 23 is turned off. The pressure within the vacuum chamber 20 is brought back to atmospheric pressure and the substrate 5 is removed from the chamber.

It should be pointed out that the method is not limited to the developed photoresist being metallised by an evaporation process. Any suitable process for depositing a metal film on the developed photoresist can be used. For example, a sputtering process can be used to deposit the metallic layer.

Once the metallic film has been deposited on the layer of developed photoresist it can then be further processed if necessary. For example, where the reflector is to be incorporated into an active matrix display device, the metallic layer can be patterned to define a plurality of pixel electrodes. This can be done by any conventional technique.

Figure 7B:
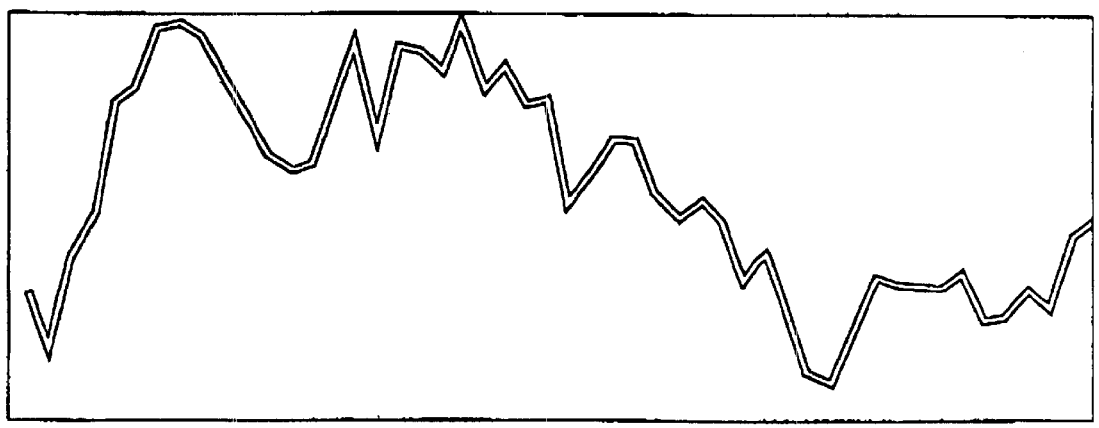

FIG. 7(b) illustrates a mask used for another embodiment of the present invention. This mask again consists of a plurality of transparent lines defined in an opaque background (only one of the lines is shown in FIG. 7(b) for convenience). The transparent lines in the mask of 7(b) are not straight as in the mask of FIG. 7(a). Instead, the transparent lines are piece-wise linear and irregular.

FIG. 10(b) is a schematic isometric view of the layer of developed photoresist that is obtained if the mask of 7(b) is used in place of the mask of FIG. 7(a) in the process described above. The developed layer of photoresist again has a blazed structure, but the "crests" of the blazes are not straight lines. Instead, the crests of the blazed structure vary piece-wise linearly and irregularly in the x and y directions, in a manner generally corresponding to the shape of the transparent lines in the mask of FIG. 7(b). The height of the crests above the substrate will, however, be substantially constant, and will be substantially the same as the height of the create in the developed photoresist layer shown in FIG. 10(a).

The displacement of the crests of the blazed structure in the x and y directions will result in an azimuthal distribution of slopes with identical inclination. When a developed layer of photoresist having the form shown in FIG. 10(b) is provided with a reflective layer so as to form a reflector, the resultant reflector will scatter reflected light into a range of azimuthal angles. Thus, the presented method makes possible the production of the present invention, an asymmetric diffuser-reflector.

A further advantage of the irregular crests is that diffraction will occur if a reflector having linear, evenly-spaced crests is illuminated by a single light source. The use of irregular crests will prevent this diffraction occurring.

A through hole or via in the layer of developed photoresist, can be easily produced during the process of exposing the un-developed photoresist. Once the photoresist layer 4 has been exposed as described hereinabove in order to define the blazed structure in the photoresist, a portion of the photoresist layer is then exposed such that the depth of exposure of the photoresiut is equal to the thickness of the layer of photoresist. This can be done, for example, using another mask which contains transparent portions corresponding in number, position and size to the required vias. Alternatively, the mask 16 can have apertures large enough to fully expose the photoresist 4 in its entire depth at the appropriate location to create the through hole.

When the photoresist is developed, a through hole will be formed in each region where the photoresist was completely exposed. The through hole(s) will be filled with metal when the metallic layer is deposited on the photoresist, so forming an electrical connection through the layer of developed photoresist. This allows the reflective layer to be electrically connected to components on the substrate 5. The invention thus provides a reflector suitable for use inside an active matrix display device.

Where the reflective layer is patterned to define a plurality of pixel electrodes or sub-pixel electrodes, a separate via is required to connect each pixel electrode or sub-pixel electrode with its associated switching element.

Where a through hole is produced in the photoresist layer, the evaporation source and the photoresist layer are preferably moved in a circular fashion with respect to one another during the evaporation of the metallic layer onto the photoresist layer. This is to ensure that a continuous metallic coating on the wall of the via.

For a further embodiment of the invention the separation between adjacent transparent lines of the mask contains random variations. These variations will cause corresponding random variations in the separation between adjacent crests of the layer of developed photoresist, and these will increase the azimuthal scattering of light. This enhances the non-diffractive nature of the reflections from the reflective layer.

Figure 12:
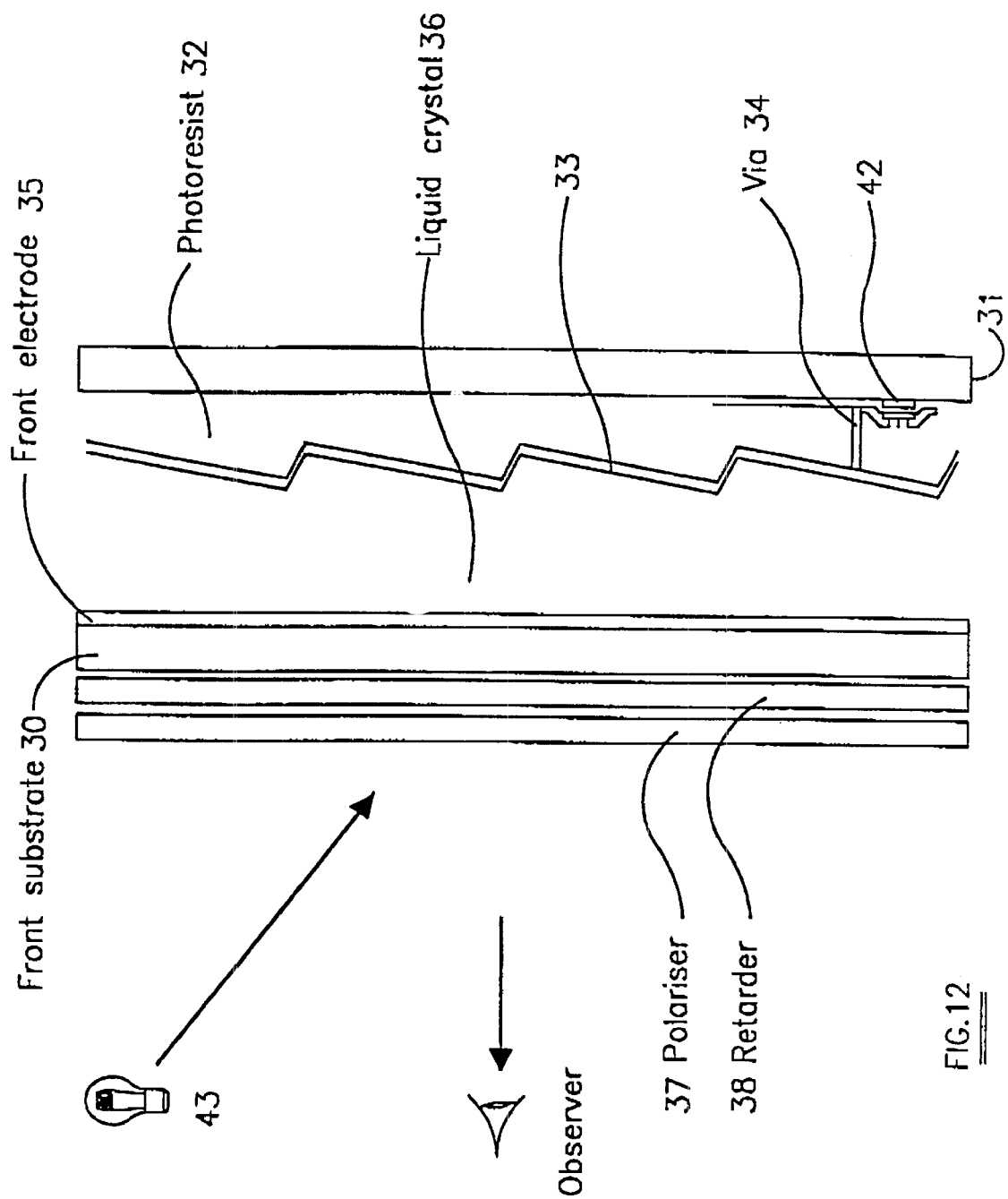
FIG. 12 is a schematic detailed view of a liquid crystal device incorporating a reflector according to the present invention disposed within the device.

FIG. 12 is a cross-sectional detailed view of a liquid crystal display device incorporating a reflector according to the present invention. The reflector is disposed internally within the liquid crystal device, so that problems with optical cross-talk and parallax will be minimized and so that the reflector will not be shaded by other components of the device.

The liquid crystal display device of the invention comprises a front substrate 30 and a rear substrate 31. The rear substrate 31 is an active matrix substrate, and is provided with switching elements 42 such as thin film transistors (TFTs) for controlling the pixel electrodes. Electrode lines (not shown) are also disposed on the rear substrate 31.

A reflector is provided over the rear substrate, over the thin film transistors. The reflector consists of a layer of developed photoresist 32 with a blazed profile, which is produced as described above, and a metallic thin film 33 disposed over the layer of photoresist. The reflector acts as, firstly, an optical reflector and, secondly, a pixel electrode.

A via 34 is formed in the layer 32 of developed photoresist. This via is filled with metal, during the step of depositing the metallic electrode 33 on the photoresist layer, and this enables the electrode 33 to be electrically connected to the switching element 42 on the rear substrate 31.

The front substrate 30 is provided with a planar front electrode 35, which acts as a common electrode.

A liquid crystal layer 36 18 disposed between the front and rear substrates. Alignment layers (not shown) are disposed on the front electrode 35 and on the mirror electrode 33 to control the orientation of the liquid crystal molecules in the liquid crystal layer 36.

A colour filter array may be used between the front substrate 30 and the front electrode 35.

Finally, a polariser 37 and a retarder 38 may be disposed in front of the front substrate 30 if required by the liquid crystal mode employed.

In use, the device is illuminated from the front, by an off-axis light source 43. Since the device contains a blazed reflector, light from the off-axis light source is reflected substantially in the normal direction.

The device of FIG. 12 is manufactured generally using conventional techniques. In particular, the active matrix substrate 31 carrying the thin film transistors or other switching elements is manufactured by any conventional manufacturing process. The active matrix substrate is then coated with photoresist, and exposed as described above in order to define the blazed structure in the photoresist. If required, it is then exposed again, in order to define a via 34 for each pixel electrode in the photoresist. The photoresist layer is subsequently developed, and the metallic coating is then deposited on the developed layer of photoresist, and patterned to define the pixel electrodes.

The front substrate 30 is manufactured by any conventional technique. The front and rear substrates are then incorporated into a liquid crystal device by conventional techniques.

Figure 13:
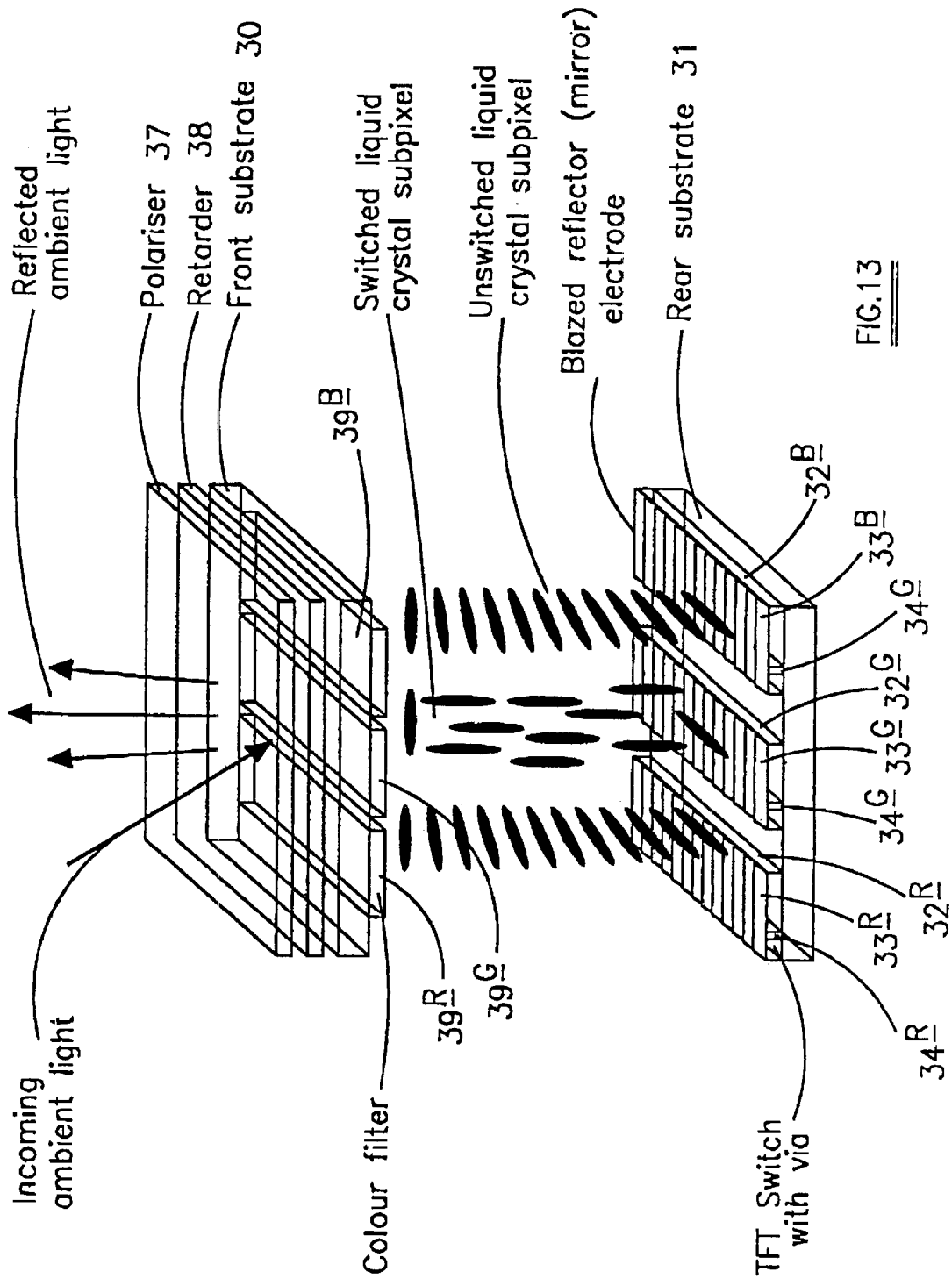
FIG. 13 is a schematic isometric view of a liquid crystal display device according to another embodiment of the present invention.

FIG. 13 is a schematic isometric view of a liquid crystal display device according to another embodiment of the present invention. This generally corresponds to the device shown in FIG. 12, except that FIG. 13 shows a full colour device in which each pixel is provided with colour filters 39R, 39G, 39B to produce red, green and blue sub-pixels. Each sub-pixel is provided with a separate reflective electrode 33R, 33G, 33B on the rear substrate 31, Each of these electrodes has the blazed structure shown in FIG. 12, and consists of a layer 32R, 32G, 32B of photoresist having a blazed structure coated with a metallic layer.

Each of the reflective electrodes 33R, 33G, 33B is controlled independently by an associated switching element such as a thin film transistor (not shown). Each electrode is connected to its associated switching element by means of a via 34R, 34G, 34B defined in the photoresist layer and filled with metal so as to provide a conductive path between the electrode and the switching element.

The upper electrode 35 has been omitted from FIG. 13, for clarity.

A black and white display would have the same general structure as the full colour display of FIG. 13, except that the colour filters 39R, 39G, 39B would not be required. Furthermore it would not be necessary to divide a pixel into sub-pixels (although this could be done to provide intermediate grey levels).

Although the present invention has been described with reference to preferred embodiments, the invention is not limited to these preferred embodiments.

Although the method described above use a layer of positive photoresist, the method could in principle be used with a negative photoresist.

In FIGS. 7(a) and 7(b) the transparent lines in the masks are continuous across the width of the mask. It is, however, possible for the transparent lines to be intermittent. For example, in a pixellated display parts of the reflector will be correspond to the inter-pixel gaps and will be obscured by a black mask; there is no need to provide such regions of the reflector with a blazed structure.

The bases of the recesses in the layer of developed photoresist are shown with a straight profile in FIG. 9. However, the bases of the recesses are not limited to this profile and could alternatively have a concave or a convex profile. This will produce increased scattering in the zenithal direction.

A blazed reflector of the present invention can be used as the reflector in a transflective display device of the type disclosed in co-pending UK patent application No. 9820516.4. For use in this application, the reflective coating must be sufficiently thin for the blazed ref lector to be partially reflective and partially transmissive, Alternatively, the reflective coating must cover only part of each pixel of the display (or only part of each sub-pixel if the pixels are divided into sub-pixels).

What is claimed is:

1. A reflective optical element comprising:
   a microscopically structured layer having a first substantially planar surface and a second surface having a reflective layer thereon,
   wherein the said second surface comprises a plurality of blazed elements, each blazed element having a first and second azimuthal angle with respect to the first surface in a first direction, wherein at least one of the first and second azimuthal angles of the plurality of blazed elements vary over a line of blazed elements in a second direction within the plane of the layer perpendicular to the first direction.

2. A reflective optical element as in claim 1, wherein the reflective layer is an electrically conductive layer.

3. A reflective optical element as in claim 1, wherein the reflective layer is a metallic layer.

4. A reflective optical element as in claim 1, wherein the first azimuthal angle of each blazed element varies randomly with respect to the second direction.

5. A reflective optical element as in claim 1, wherein the first azimuthal angle of each blazed over a pre-determined range with respect to the second direction.

6. A reflective optical element as in claim 5, wherein said pre-determined range of first azimuthal angles with respect to the first direction within the plane of the layer is −90° to +90°.

7. A reflective optical element as in claim 5, wherein said pre-determined range of first azimuthal angles with respect to the first direction within the plane of the layer is −45° to +45°.

8. A reflective optical element as in claim 1, wherein each of said first and second azimuthal angle has a pre-determined probability of occurance with respect to all other first and second azimuthal angles, respectively.

9. A reflective optical element as in claim 1, wherein said structured layer is in contact with a substrate forming part of an electrooptical device.

10. A reflective optical element as in claim 9, wherein said substrate is an active matrix substrate for a liquid crystal device.

11. A reflective optical element as in claim 1, wherein said microscopically structured layer includes at least one via.

12. A reflective optical element as in claim 11, wherein said via is filled with a conductive element for electrical connection to said electrically conductive layer.

13. An electrooptic display device comprising: front and rear substrates; a layer of electrooptic material disposed between the front and rear substrate; a reflective optical element having a blazed profile disposed behind the electrooptic material, said reflective optical element comprising a microscopically structured layer having a blazed structure comprising a plurality of blazed elements, each blazed element having a first and second azimuthal angle with respect to the rear substrate in a first direction, wherein at least one of the first and second azimuthal angles of the plurality of blazed elements vary over a line of blazed elements in a second direction within the plane of the layer perpendicular to the first direction and a reflective layer disposed on said blazed structure.

14. An electrooptic display device as in claim 13 wherein said electrooptic display device is a liquid crystal display device further comprising: active switching elements on the rear substrate; a layer of liquid crystal forming the electrooptic material disposed between the first substrate and the reflective optical element.

15. An electrooptic display device as in claim 13, wherein said reflective layer is electrically conductive.

16. An electrooptic display device as in claim 13, wherein said reflective layer to metallic.

17. An electrooptic display device as in claim 14, wherein said reflective layer to a pixel electrode.

18. An electrooptic display device as in claim 14, wherein said switching elements are thin film transistors.

19. An electrooptic display device as in claim 13, wherein on a surface of said microscopically structured layer in contact with the reflective layer the first azimuthal angle of each blazed element varies randomly with respect to the second direction.

20. An electrooptic display device as in claim 13, wherein the first azimuthal angle of each blazed element varies over a pre-determined range with respect to the second direction.

21. An electrooptic display device as in claim 20, wherein said pre-determined range of first azimuthal angles with respect to the first direction within the plane of the layer is −90° to +90°.

22. An electrooptic display device as in claim 20, wherein said pre-determined range of first azimuthal angles with respect to the first direction within the plane of the layer is −45° to +45°.

23. An electro-optic display device as in claim 14, wherein each of said first and second azimuthal angle has a pre-determined probability of occurance with respect to all other first and second azimuthal angles, respectively.

24. A liquid crystal display device as in claim 14, further comprising a planar front electrode on said front substrate.

25. A liquid crystal display device as in claim 14, further comprising a polarizer in front of said front substrate.

26. A liquid crystal display device as in claim 25, further comprising a retarder in front of said front substrate.

27. A liquid crystal display device as in claim 14, further comprising separate color filters in each pixel of the device, each said separate color filter forming a sub-pixel.

28. A liquid crystal display device as in claim 27, wherein each said sub-pixel is provide with a separate reflective electrode and each reflective electrode is inclined at two or more angles with respect to said front substrate to create a plurality of piece-wise linear blazed structures varying over a range of azimuthal angles with respect to one direction, within the plane of the layer.

* * * * *